(12) United States Patent
Miyamoto et al.

(10) Patent No.: US 10,704,928 B2
(45) Date of Patent: Jul. 7, 2020

(54) PROXIMITY SENSOR AND METHOD OF CHANGING DETECTION DISTANCE

(71) Applicant: OMRON Corporation, Kyoto (JP)

(72) Inventors: Kazuaki Miyamoto, Fukuchiyama (JP); Ryota Hasegawa, Ayabe (JP); Hiroyuki Tsuchida, Ayabe (JP)

(73) Assignee: OMRON Corporation, Kyoto (JP)

( * ) Notice: Subject to any disclaimer, the term of this patent is extended or adjusted under 35 U.S.C. 154(b) by 52 days.

(21) Appl. No.: 16/161,082

(22) Filed: Oct. 16, 2018

(65) Prior Publication Data

US 2019/0234765 A1 Aug. 1, 2019

(30) Foreign Application Priority Data

Jan. 29, 2018 (JP) .................... 2018-012571

(51) Int. Cl.
*G01D 5/20* (2006.01)
*H03K 17/95* (2006.01)
*H03B 5/08* (2006.01)

(52) U.S. Cl.
CPC ............. *G01D 5/2006* (2013.01); *H03B 5/08* (2013.01); *H03K 17/9547* (2013.01); *H03K 2217/956* (2013.01)

(58) Field of Classification Search
CPC ............. G01D 5/2006; H03K 17/9547; H03K 2217/956; H03B 5/08

(Continued)

(56) References Cited

U.S. PATENT DOCUMENTS 6,335,619 B1 * 1/2002 Schwab ............... G01D 3/036
324/207.12
2005/0231360 A1 * 10/2005 Fujimori ............ H03K 17/9547
340/539.23

(Continued)

FOREIGN PATENT DOCUMENTS

| EP | 3197053 | 7/2017 |
|---|---|---|
| JP | 2008166055 | 7/2008 |
| WO | 0035092 | 6/2000 |

OTHER PUBLICATIONS

"Search Report of Europe Counterpart Application", dated Apr. 2, 2019, p. 1-p. 8.

(Continued)

*Primary Examiner* — Christopher P McAndrew
(74) *Attorney, Agent, or Firm* — JCIPRNET

(57) ABSTRACT

A proximity sensor and a method of changing a detection distance are provided to suppress changes in a consumption current of an oscillation circuit. The proximity sensor includes an oscillation circuit having an oscillation amplitude that changes with a feedback current, a comparing part comparing the oscillation amplitude with a threshold, a detecting part detecting a target object based on a comparison result of the comparing part, a voltage value signal generating part generating a voltage value signal based on the feedback current and the detection distance, a threshold setting part setting an analog signal converted from the voltage value signal as the threshold, a current value signal generating part generating a current value signal based on the detection distance and the voltage value signal, and a current value setting part setting an analog signal converted from the current value signal as a current value of the feedback current.

14 Claims, 7 Drawing Sheets

(58) Field of Classification Search
USPC .................................................. 324/207.16
See application file for complete search history.

(56) References Cited

U.S. PATENT DOCUMENTS

| | | | | |
|---|---|---|---|---|
| 2006/0012443 A1* | 1/2006 | Sauter | ............... | H03K 17/9547 331/23 |
| 2008/0197839 A1* | 8/2008 | Machul | .............. | H03K 17/9512 324/236 |
| 2014/0266487 A1* | 9/2014 | Vaishnav | ............... | H03G 3/001 331/183 |
| 2017/0212265 A1* | 7/2017 | Nakayama | ......... | H03K 17/9547 |
| 2017/0214409 A1* | 7/2017 | Kondo | .................... | H04B 1/38 |

OTHER PUBLICATIONS

"Third Party Observation of Europe Counterpart Application", issued on Sep. 3, 2019, p. 1-p. 4.

* cited by examiner

PROXIMITY SENSOR AND METHOD OF CHANGING DETECTION DISTANCE

CROSS-REFERENCE TO RELATED APPLICATION

This application claims the priority benefit of Japan Application No. 2018-012571, filed on Jan. 29, 2018. The entirety of the above-mentioned patent application is hereby incorporated by reference herein and made a part of this specification.

BACKGROUND

Technical Field

The disclosure relates to a proximity sensor and a method of changing a detection distance.

Description of Related Art

As one of this type, a proximity sensor including a two-thread coil in which one of two coil conductive wires serves as a coil for a resonance circuit and the other serves as a coil for copper resistance compensation, a capacitor which is connected in parallel to the two-thread coil to form the resonance circuit, and a drive circuit which drives the resonance circuit at a constant frequency is known (see Patent Document 1: Japanese Laid-Open No. 2008-166055). By adopting the separate excitation configuration in which the resonance circuit constituted by the two-thread coil and the capacitor is driven externally at a constant frequency, the detection distance of this proximity sensor can be lengthened not only for a ferromagnetic metal such as iron but also for a non-magnetic metal such as aluminum.

Meanwhile, there is a demand for being able to change the distance from the coil of the resonance circuit to the position where the target object can be detected (hereinafter referred to as "detection distance"). To meet the demand, a method of changing the detection distance by changing the feedback current flowing through an oscillation circuit, so that the oscillation amplitude of the oscillation circuit including the resonance circuit is set at a predetermined value, is adopted in the conventional practice.

Here, in the case of changing the detection distance to a distance shorter than the current distance, the conductance of the resonance circuit increases. Therefore, if the feedback current is changed to set the oscillation amplitude of the oscillation circuit at the predetermined value as in the conventional practice, the feedback current increases and the consumption current of the oscillation circuit also increases. Therefore, the consumption current of the oscillation circuit differs as the detection distance differs.

SUMMARY

A proximity sensor according to an embodiment of the disclosure includes an oscillation circuit including a coil and having an oscillation amplitude that changes with a feedback current, a comparing part comparing the oscillation amplitude with a threshold, a detecting part detecting a target object based on a comparison result of the comparing part, a voltage value signal generating part generating a voltage value signal indicating a digital quantity of a voltage value based on the feedback current and a detection distance indicating a distance from the coil to a position where the target object can be detected, a threshold setting part setting an analog signal converted from the voltage value signal as the threshold, a current value signal generating part generating a current value signal indicating a digital quantity of a current value based on the detection distance and the voltage value signal, and a current value setting part setting an analog signal converted from the current value signal as a current value of the feedback current.

Another embodiment of the disclosure provides a method of changing a detection distance, by which a proximity sensor changes the detection distance indicating a distance from a coil to a position where a target object can be detected, the proximity sensor including an oscillation circuit that includes the coil and has an oscillation amplitude that changes with a feedback current, a comparing part that compares the oscillation amplitude with a threshold, and a detecting part that detects the target object based on a comparison result of the comparing part. According to the method, a voltage value signal indicating a digital quantity of a voltage value is generated by a voltage value signal generating part based on the feedback current and the detection distance, an analog signal converted from the voltage value signal is set as the threshold by a threshold setting part, a current value signal indicating a digital quantity of a current value is generated by a current value signal generating part based on the detection distance and the voltage value signal, and an analog signal converted from the current value signal is set as the current value of the feedback current by a current value setting part.

DESCRIPTION OF THE EMBODIMENTS

Figure 1:
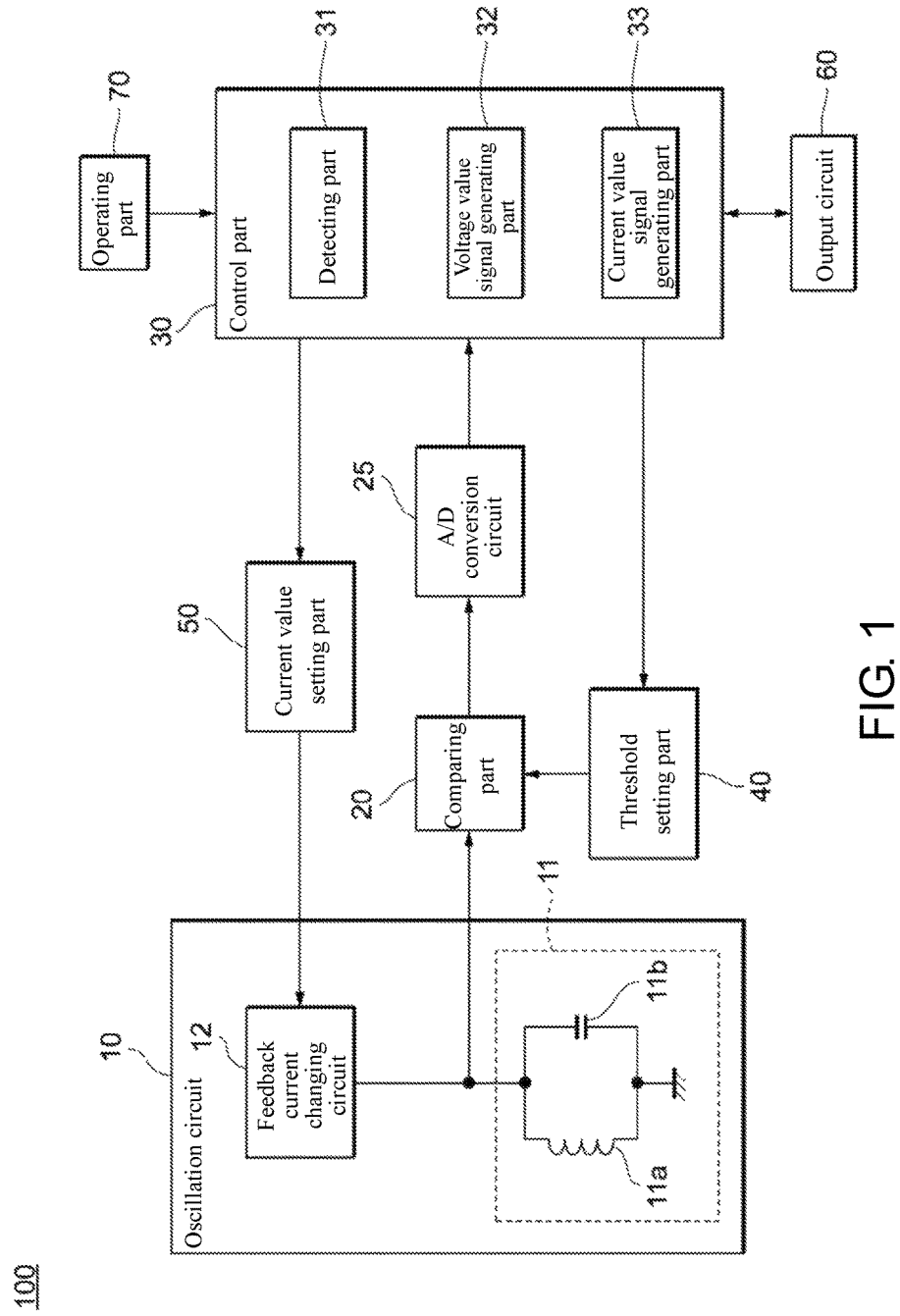
FIG. 1 is a circuit block diagram illustrating the configuration of a proximity sensor according to an embodiment.

The disclosure provides a proximity sensor and a method of changing the detection distance, which can suppress the change in the consumption current of the oscillation circuit due to the detection distance.

A proximity sensor according to an embodiment of the disclosure includes an oscillation circuit including a coil and having an oscillation amplitude that changes with a feedback current, a comparing part comparing the oscillation amplitude with a threshold, a detecting part detecting a target object based on a comparison result of the comparing part, a voltage value signal generating part generating a voltage value signal indicating a digital quantity of a voltage value based on the feedback current and a detection distance indicating a distance from the coil to a position where the target object can be detected, a threshold setting part setting an analog signal converted from the voltage value signal as the threshold, a current value signal generating part generating a current value signal indicating a digital quantity of a current value based on the detection distance and the voltage value signal, and a current value setting part setting an analog signal converted from the current value signal as a current value of the feedback current.

According to an embodiment of the disclosure, based on the feedback current and the detection distance indicating the distance from the coil to the position where the target object can be detected, the voltage value signal indicating the digital quantity of the voltage value is generated, and the analog signal converted from the voltage value signal is set as the threshold. Here, by using the relationship among the current value of the feedback current, the detection distance and the threshold for the oscillation amplitude, the threshold for the oscillation amplitude can be determined by the current value of the feedback current and the detection distance. Accordingly, under the oscillation amplitude of the current feedback current, the threshold based on the detection distance can be set. Also, based on the detection distance and the voltage value signal, the current value signal indicating the digital quantity of the current value is generated, and the analog signal converted from the current value signal is set as the current value of the feedback current. Here, by using the relationship among the current value of the feedback current, the detection distance and the threshold for the oscillation amplitude, the current value of the feedback current can be determined by the detection distance and the threshold for the oscillation amplitude. Accordingly, with the relationship of the oscillation amplitude in the detection distance with respect to the voltage value indicated by the voltage value signal, that is, the threshold set for the oscillation amplitude, such as being higher or lower than or equal to the threshold, the current value of the feedback current can be set. Therefore, compared to the case of changing the current value of the feedback current when the threshold is kept constant, the amount in which the feedback current is changed can be reduced. Thus, the change in the consumption current of the oscillation circuit due to the set distance can be suppressed.

According to an embodiment of the disclosure, the voltage value signal generating part may generate the voltage value signal for the voltage value corresponding to the detection distance under the oscillation amplitude at the time of maintaining the current value of the feedback current.

According to an embodiment of the disclosure, the voltage value signal is generated for the voltage value corresponding to the detection distance under the oscillation amplitude at the time of maintaining the current value of the feedback current. Accordingly, since the voltage value corresponding to the detection distance is set as the threshold in the state of maintaining the current value of the feedback current, the threshold corresponding to the detection distance can be changed without changing the consumption current of the oscillation circuit.

According to an embodiment of the disclosure, the current value signal generating part may generate the current value signal for the current value of the feedback current at which the oscillation amplitude in the detection distance is at the voltage value indicated by the voltage value signal.

According to an embodiment of the disclosure, the current value signal is generated for the current value of the feedback current at which the oscillation amplitude in the detection distance is at the voltage value indicated by the voltage value signal. Accordingly, the current value of the feedback current can be set at a value at which the oscillation amplitude in the detection distance is set to be equal to the voltage value indicated by the voltage value signal, that is, the set threshold. Therefore, compared with the case where the threshold is kept constant, the set current value of the feedback current needs only a subtle amount of change such that the oscillation amplitude becomes equal to the threshold changed based on the detection distance. Therefore, the configuration for suppressing the change in the consumption current of the oscillation circuit due to the set distance can be realized easily.

According to an embodiment of the disclosure, the threshold setting part includes a first D/A conversion circuit having an output voltage range wider than a range of change in the oscillation amplitude and having a resolution of a first bit number, the current value setting part includes a second D/A conversion circuit having a resolution of a second bit number, and the first bit number may be smaller than the second bit number.

According to an embodiment of the disclosure, the threshold setting part includes the first D/A conversion circuit having an output voltage range wider than the range of change in the oscillation amplitude and having a resolution of the first bit number, and the first bit number is smaller than the second bit number. Accordingly, the first D/A conversion circuit only needs to have a range of change in the output voltage wider than the range of change in the oscillation amplitude and a resolution lower than that of the second D/A conversion circuit. Therefore, for setting the threshold for the oscillation amplitude, the circuit area is reduced, the proximity sensor can be downsized, and the cost of parts can be reduced as compared to the case where a D/A conversion circuit having a wide range of change as well as a high resolution (high accuracy) is included. Also, the current value setting part includes the second D/A conversion circuit having a resolution of the second bit number. Accordingly, since the second D/A conversion circuit includes a D/A conversion circuit having a higher resolution than that of the first D/A conversion circuit, the voltage value of the feedback current can be set with high accuracy. Meanwhile, since the threshold can be set within a wide range of the first D/A conversion circuit, the second D/A conversion circuit only needs to have a narrow range of change. Therefore, for setting the voltage value of the feedback current, the circuit area is reduced, the proximity sensor can be downsized, and the cost of parts can be reduced as compared to the case where a D/A conversion circuit with a wide range of change as well as a high resolution (high accuracy) is included.

According to an embodiment of the disclosure, the first bit number may be 6 bits and the second bit number may be 13 bits.

According to an embodiment of the disclosure, the first bit number is 6 bits. Accordingly, the first D/A conversion circuit having an output voltage range wider than the range of change in the oscillation amplitude and having a lower resolution than that of the second D/A conversion circuit can be easily constructed. Also, the second bit number is 13 bits. Accordingly, the second D/A conversion circuit having a higher resolution than that of the first D/A conversion circuit can be easily constructed.

According to an embodiment of the disclosure, the proximity sensor may further include an operating part for inputting detection distance information or a detection distance adjustment command.

According to an embodiment of the disclosure, the proximity sensor further includes the operating part for inputting the detection distance information or the detection distance adjustment command. Accordingly, for example, when the user inputs the detection distance information or the detection distance adjustment command via the operating part after configuring the target object in the detection distance to be adjusted, since the threshold based on the detection distance and the current value of the feedback current are set, the detection distance can be changed as desired by the user.

According to an embodiment of the disclosure, the proximity sensor may further include an output circuit for receiving a detection distance adjustment command through IO-LINK communication.

According to an embodiment of the disclosure, the proximity sensor further includes the output circuit for receiving the detection distance adjustment command through IO-LINK communication. Accordingly, for example, when the output circuit receives the detection distance adjustment command corresponding to the detection distance through IO-LINK communication after the user configures the target object in the detection distance to be adjusted, since the threshold based on the detection distance and the current value of the feedback current are set, the detection distance can be changed as desired by the user.

Another embodiment of the disclosure provides a method of changing a detection distance, by which a proximity sensor changes the detection distance indicating a distance from a coil to a position where a target object can be detected, the proximity sensor including an oscillation circuit that includes the coil and has an oscillation amplitude that changes with a feedback current, a comparing part that compares the oscillation amplitude with a threshold, and a detecting part that detects the target object based on a comparison result of the comparing part. According to the method, a voltage value signal indicating a digital quantity of a voltage value is generated by a voltage value signal generating part based on the feedback current and the detection distance, an analog signal converted from the voltage value signal is set as the threshold by a threshold setting part, a current value signal indicating a digital quantity of a current value is generated by a current value signal generating part based on the detection distance and the voltage value signal, and an analog signal converted from the current value signal is set as the current value of the feedback current by a current value setting part.

According to an embodiment of the disclosure, based on the feedback current and the detection distance, the voltage value signal indicating the digital quantity of the voltage value is generated, and the analog signal converted from the voltage value signal is set as the threshold. Here, the threshold for the oscillation amplitude can be determined by the current value of the feedback current and the detection distance by using the relationship among the current value of the feedback current, the detection distance, and the threshold for the oscillation amplitude. Accordingly, under the oscillation amplitude of the current feedback current, the threshold based on the detection distance can be set. Also, based on the detection distance and the voltage value signal, the current value signal indicating the digital quantity of the current value is generated, and the analog signal converted from the current value signal is set as the current value of the feedback current. Here, the current value of the feedback current can be determined by the detection distance and the threshold for the oscillation amplitude by using the relationship among the current value of the feedback current, the detection distance, and the threshold for the oscillation amplitude. Accordingly, with the relationship of the oscillation amplitude in the detection distance with respect to the voltage value indicated by the voltage value signal, that is, the threshold set for the oscillation amplitude, such as being higher or lower than or equal to the threshold, the current value of the feedback current can be set. Therefore, compared to the case of changing the current value of the feedback current when the threshold is kept constant, the amount in which the feedback current is changed can be reduced. Thus, the change in the consumption current of the oscillation circuit due to the set distance can be suppressed.

According to an embodiment of the disclosure, generating the voltage value signal may include generating the voltage value signal for the voltage value corresponding to the detection distance by the voltage value signal generating part under the oscillation amplitude at the time of maintaining the current value of the feedback current.

According to an embodiment of the disclosure, the voltage value signal is generated for the voltage value corresponding to the detection distance under the oscillation amplitude at the time of maintaining the current value of the feedback current. Accordingly, since the voltage value corresponding to the detection distance is set as the threshold in the state of maintaining the current value of the feedback current, the threshold corresponding to the detection distance can be changed without changing the consumption current of the oscillation circuit.

According to an embodiment of the disclosure, generating the current value signal may include generating the current value signal for the current value of the feedback current at which the oscillation amplitude in the detection distance is at the voltage value indicated by the voltage value signal by the current value signal generating part.

According to an embodiment of the disclosure, the current value signal is generated for the current value of the feedback current at which the oscillation amplitude in the detection distance is at the voltage value indicated by the voltage value signal. Accordingly, the current value of the feedback current can be set at a value at which the oscillation amplitude in the detection distance is set to be equal to the voltage value indicated by the voltage value signal, that is, the set threshold. Therefore, compared with the case where the threshold is kept constant, the set current value of the feedback current needs only a subtle amount of change such that the oscillation amplitude becomes equal to the threshold changed based on the detection distance. Therefore, the configuration for suppressing the change in the consumption current of the oscillation circuit due to the set distance can be realized easily.

According to an embodiment of the disclosure, the method may further include inputting detection distance information or a detection distance adjustment command to an operating part.

According to an embodiment of the disclosure, the detection distance information or the detection distance adjustment command is input to the operating part. Accordingly, for example, when the user inputs the detection distance information or the detection distance adjustment command via the operating part after configuring the target object in the detection distance to be adjusted, since the threshold based on the detection distance and the current value of the feedback current are set, the detection distance can be changed as desired by the user.

According to an embodiment of the disclosure, the method may further include receiving a detection distance adjustment command by an output circuit through IO-LINK communication.

According to an embodiment of the disclosure, the detection distance adjustment command is further received by the output circuit through IO-LINK communication. Accordingly, for example, when the output circuit receives the detection distance adjustment command corresponding to the detection distance through IO-LINK communication after the user configures the target object in the detection distance to be adjusted, since the threshold based on the detection distance and the current value of the feedback current are set, the detection distance can be changed as desired by the user.

According to the embodiments of the disclosure, a proximity sensor and a method of changing a detection distance, which can suppress change in the consumption current of the oscillation circuit due to the detection distance, can be provided.

Exemplary embodiments of the disclosure will be described with reference to the accompanying drawings. In the drawings, the same reference numerals are given to the same or similar configurations.

Configuration Example

Figure 2:
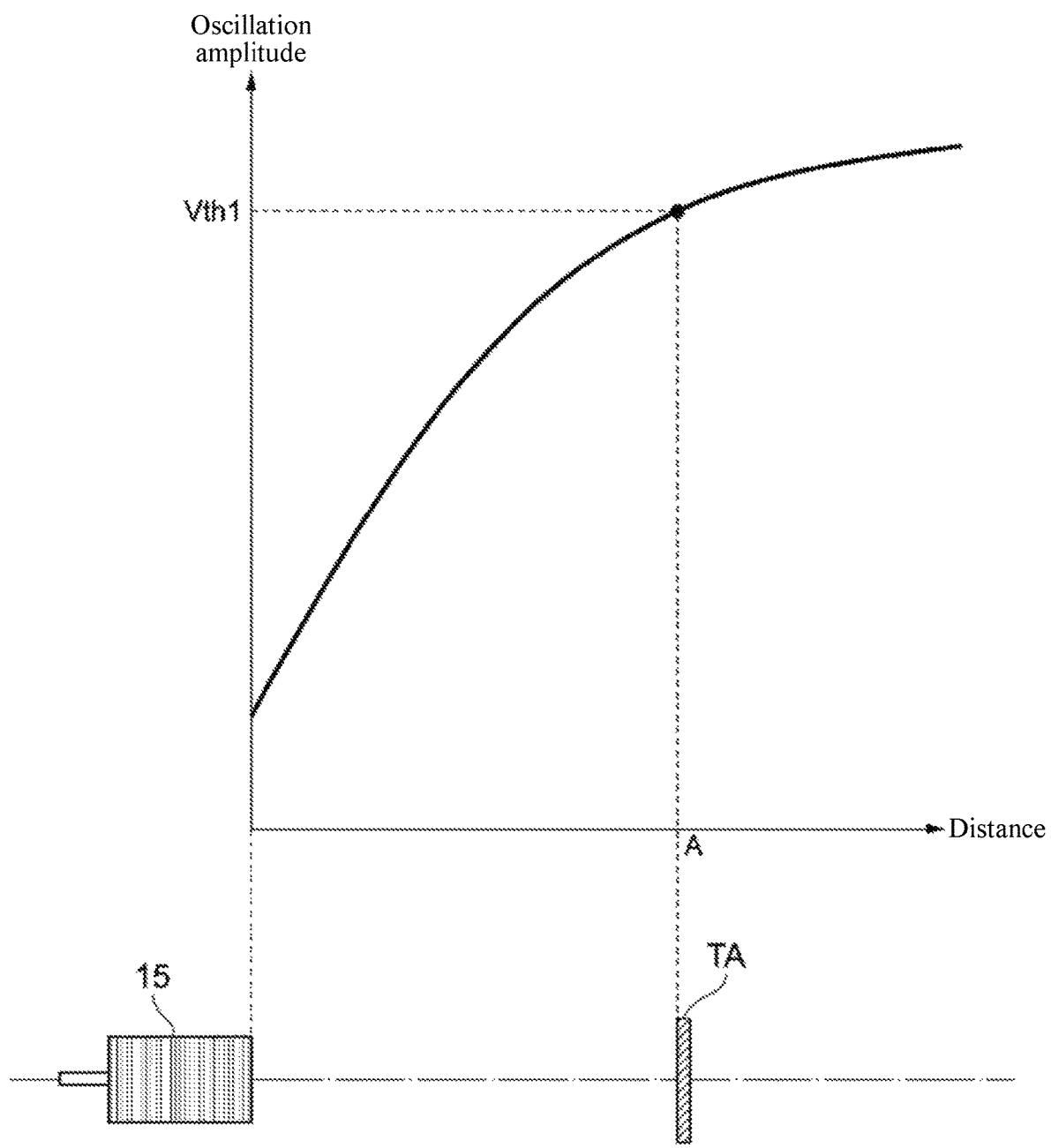
FIG. 2 is a diagram illustrating a relationship between an oscillation amplitude of an oscillation circuit and a distance from a coil to a target object.
Figure 3:
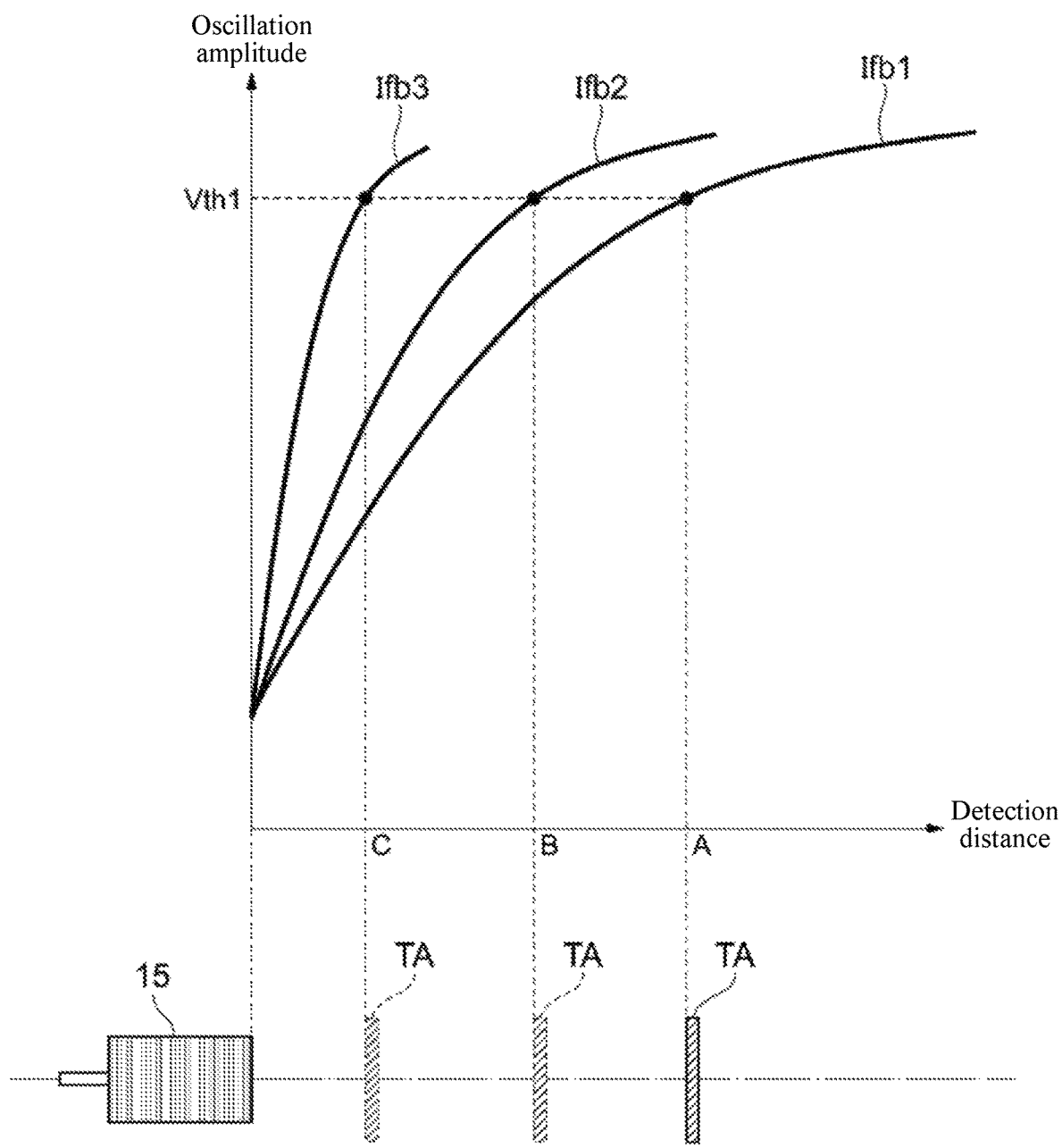
FIG. 3 is a diagram illustrating a relationship between a detection distance and a current value of a feedback current.
Figure 4:
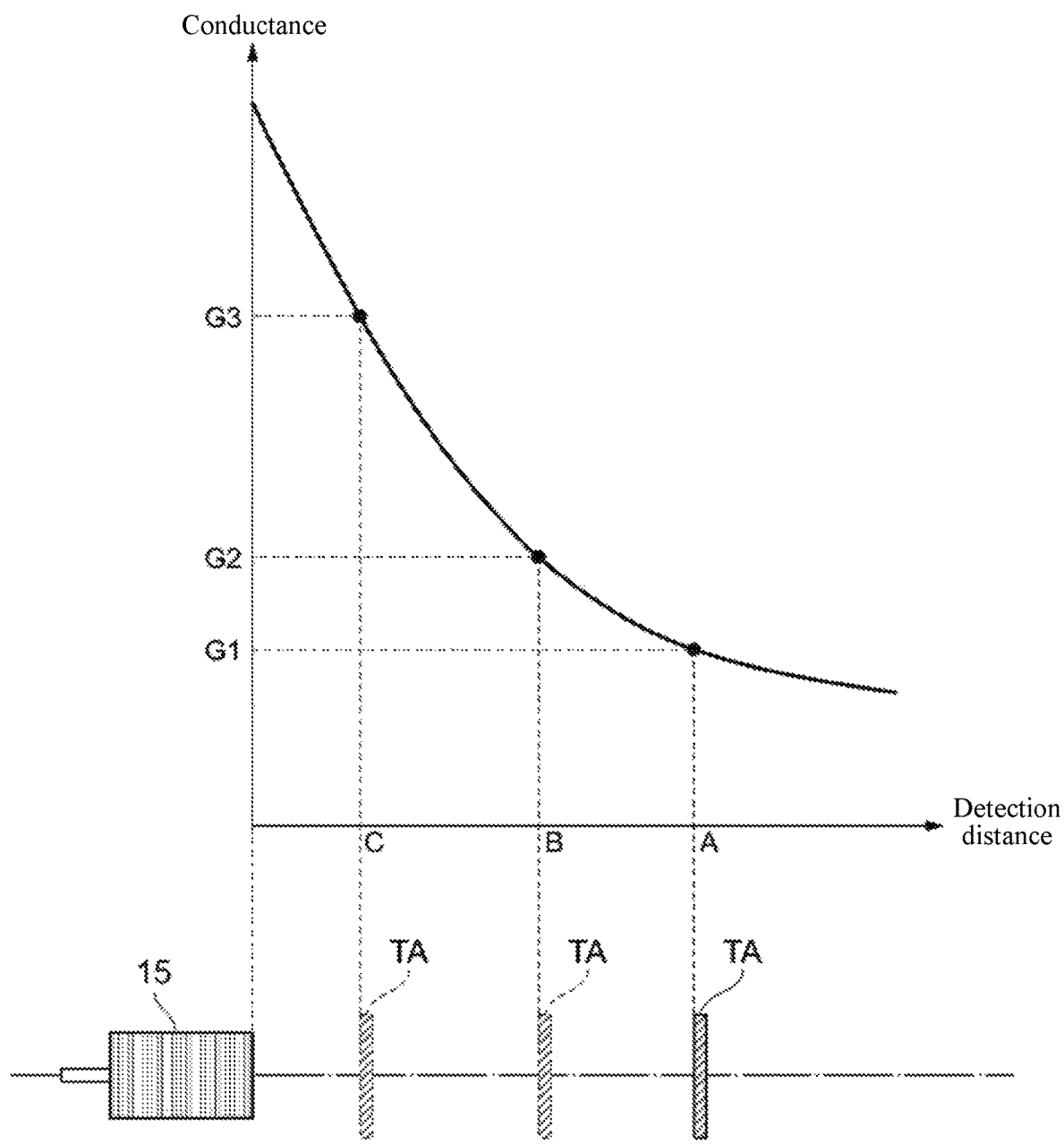
FIG. 4 is a diagram illustrating the relationship between the detection distance and a conductance of a resonance circuit.

First, an example of the configuration of a proximity sensor according to this embodiment will be described with reference to FIGS. 1 to 4. FIG. 1 is a circuit block diagram illustrating the configuration of a proximity sensor 100 according to this embodiment. FIG. 2 is a diagram illustrating a relationship between an oscillation amplitude of an oscillation circuit 10 and a distance from a coil 11a to a target object TA. FIG. 3 is a diagram illustrating a relationship between a detection distance and a current value of a feedback current. FIG. 4 is a diagram illustrating a relationship between the detection distance and a conductance of a resonance circuit 11.

The proximity sensor 100 is a sensor for detecting the target object TA. The target object TA is an object having electrical conductivity, such as metal. The target object TA may be a magnetic material, such as iron, cobalt, or the like, or may be a non-magnetic material, such as stainless steel, aluminum, copper, brass or the like. As shown in FIG. 1, the proximity sensor 100 includes the oscillation circuit 10, a comparing part 20, an A/D (analog-to-digital) conversion circuit 25, a control part 30, a threshold setting part 40, a current value setting part 50, an output circuit 60, and an operating part 70.

The oscillation circuit 10 includes the resonance circuit 11 and a feedback current changing circuit 12. The oscillation circuit 10 is configured so that the amplitude in the output voltage waveform of the oscillation circuit 10 (hereinafter referred to as "oscillation amplitude") changes with the feedback current fed back to the resonance circuit 11. The oscillation circuit 10 is accommodated in a sensor body 15 to be described later.

The resonance circuit 11 includes a coil 11a and a capacitor 11b. The coil 11a and the capacitor 11b are connected to each other in parallel and constitute a parallel resonance circuit.

The feedback current changing circuit 12 is configured to be able to change the current value of the feedback current flowing through the oscillation circuit 10. The feedback current changing circuit 12 changes the current value of the feedback current to the current value corresponding to the control signal input from the current value setting part 50.

The output voltage of the oscillation circuit 10 is input to the comparing part 20. Also, the voltage at a threshold is input to the comparing part 20 from the threshold setting part 40. The comparing part 20 is configured to compare the oscillation amplitude of the oscillation circuit 10 and the threshold, which are voltage values. The comparing part 20 includes, for example, an operational amplifier (differential amplifier circuit). In this case, the oscillation amplitude is input to the non-inverting input terminal of the operational amplifier, and the threshold is input to the inverting input terminal. Then, the operational amplifier outputs a voltage signal in which the difference between the oscillation amplitude and the threshold is amplified with a predetermined gain.

The voltage signal from the comparing part 20 is input to the A/D converting circuit 25. The A/D converting circuit 25 converts the voltage signal into a digital signal by sampling, quantization and coding, and outputs the digital signal.

The control part 30 is configured to control the operation of each part of the proximity sensor 100. The control part 30 includes, for example, a microprocessor, such as a central processing unit (CPU), and a memory, such as a read only memory (ROM), a random access memory (RAM), a buffer memory, etc. For example, as the functional configuration, the control part 30 includes a detecting part 31, a voltage value signal generating part 32, and a current value signal generating part 33.

The detecting part 31 is configured to detect the target object TA based on the comparison result provided by the comparing part 20. Specifically, the detecting part 31 detects the target object TA based on the digital-converted voltage signal of the comparing part 20 which is input from the A/D converting circuit 25.

Here, as shown in FIG. 2, when the current value of the feedback current is at a predetermined value, the oscillation amplitude has the characteristic of changing with the distance from the sensor body 15, more precisely the coil 11a of the resonance circuit 11 accommodated in the sensor body 15, to the target object TA. When the distance from the coil 11a to the target object TA is nearer (shorter), the oscillation amplitude decreases, whereas when the distance from the coil 11a to the target object TA is farther (longer), the oscillation amplitude increases. For example, the target object TA is placed in a distance A and a threshold Vth1 is set in the distance A, so that the detection distance indicating the distance to a position where the target object TA can be detected is set as the distance A. At this time, since the voltage value of the oscillation amplitude is the same as or substantially the same as the threshold Vth1, the voltage value of the voltage signal output by the comparing part 20 is close to a reference voltage value such as zero. Therefore, the detecting part 31 detects the target object TA when the voltage value digital-converted from the voltage signal of the comparing part 20 is equal to or lower than the predetermined value.

As described above, the oscillation amplitude of the oscillation circuit 10 changes with the feedback current. Therefore, as shown in FIG. 3, the properties of the detection distance and the oscillation amplitude change with current values Ifb1, Ifb2, and Ifb3 of the feedback current. For example, if the threshold Vth1 is set for the oscillation amplitude, the feedback current at the time when the target object TA can be detected in the detection distance A is at the current value Ifb1. Also, the feedback current at the time when the target object TA can be detected in the detection distance B shorter than the detection distance A is at the current value Ifb2 greater than the current value Ifb1 (current value Ifb1<current value Ifb2). Further, the feedback current at the time when the target object TA can be detected in the detection distance C shorter than the detection distance B is at the current value Ifb3 greater than the current value Ifb2 (current value Ifb2<current value Ifb3).

Thus, based on the relationship among the current value of the feedback current, the detection distance, and the oscillation amplitude or the threshold of the oscillation amplitude, if two of the current value of the feedback current, the detection distance, and the oscillation amplitude or the threshold of the oscillation amplitude are determined, the remaining one can be determined. That is, by using the relationship among the current value of the feedback current, the detection distance, and the oscillation amplitude or the threshold of the oscillation amplitude shown in FIG. 3, the oscillation amplitude or the threshold of the oscillation amplitude can be set based on the current value of the feedback current and the detection distance. Similarly, the current value of the feedback current can be set based on the detection distance and the oscillation amplitude or the threshold of the oscillation amplitude. Therefore, the control part 30 records the relationship among the current value of the feedback current, the detection distance, and the oscillation amplitude or the threshold of the oscillation amplitude shown in FIG. 3 in a memory or the like.

On the other hand, the change in the current value of the feedback current due to the change in the detection distance is in accordance with the properties of the conductance of the resonance circuit 11. That is, in the resonance circuit 11 included in the oscillation circuit 10, the conductance changes as the detection distance changes. As shown in FIG. 4, the conductance of the resonance circuit 11 becomes greater if the detection distance is nearer (shorter). For example, in the detection distance A, the resonance circuit 11 has a conductance G1. In the detection distance B shorter than the detection distance A, the resonance circuit 11 has a conductance G2 greater than the conductance G1 (conductance G1<conductance G2). Furthermore, in the detection distance C shorter than the detection distance B, the resonance circuit 11 has a conductance G3 greater than the conductance G2 (conductance G2<conductance G3).

As described above, when the detection distance A is changed to a short distance, such as the detection distance B or the detection distance C, the conductance of the resonance circuit 11 increases, as shown in FIG. 3. When the detection distance is changed to a short distance while the threshold for the oscillation amplitude is fixed, the current value of the feedback current increases. As a result, the consumption current of the oscillation circuit 10 also increases, and the consumption current of the oscillation circuit 10 differs as the detection distance differs.

Returning to the description of FIG. 1, the voltage value signal generating part 32 is configured to generate a voltage value signal indicating the digital quantity of a voltage value based on the feedback current and the detection distance. The voltage value indicated by the voltage value signal serves to be set as the threshold.

Specifically, the voltage value signal generating part 32 generates the voltage value signal for the voltage value corresponding to the detection distance under the oscillation amplitude at the time of maintaining the current value of the feedback current. The voltage value indicated by the voltage value signal is represented by a digital quantity of 6 bits, for example. The information of the feedback current is the information of the current feedback current stored in a memory or the like, and is the current value of the previous (before change) feedback current generated by the current value signal generating part 33 to be described in the following. Also, the information of the detection distance is input from the operating part 70 or the output circuit 60 to be described in the following.

The current value signal generating part 33 is configured to generate the current value signal indicating the digital quantity of the current value based on the detection distance and the voltage value signal. The current value indicated by the current value signal serves to be set as the current value of the feedback current.

Specifically, the current value signal generating part 33 generates a current value signal for the current value of the feedback current at which the oscillation amplitude in the detection distance is at the voltage value indicated by the voltage value signal. The current value indicated by the current value signal is represented by a digital quantity of 13 bits, for example. The information of the detection distance is input from the operating part 70 to be described in the following. The information of the voltage value signal is input from the voltage value signal generating part 32. Further, the current value signal generating part 33 stores the digital quantity of the generated current value signal in a memory or the like. Thus, when the detection distance is changed next time, by reading the digital quantity with the voltage value signal generating part 32, the digital quantity can be used as the current value of the current feedback current.

The voltage value signal generated by the voltage value signal generating part 32 is input to the threshold setting part 40. The threshold setting part 40 is configured to set an analog signal converted from the voltage value signal as the threshold. Therefore, based on the feedback current and the detection distance indicating the distance from the coil 11a to the position where the target object TA can be detected, the voltage value signal indicating the digital quantity of a voltage value is generated, and the analog signal converted from the voltage value signal is set as the threshold. As described above, by using the relationship among the current value of the feedback current, the detection distance, and the threshold for the oscillation amplitude, the threshold for the oscillation amplitude can be determined by the current value of the feedback current and the detection distance. Thus, under the oscillation amplitude of the current feedback current, the threshold based on the detection distance can be set.

Further, as described above, the voltage value signal is generated for the voltage value corresponding to the detection distance under the oscillation amplitude at the time of maintaining the current value of the feedback current. Accordingly, since the voltage value corresponding to the detection distance is set as the threshold in the state of maintaining the current value of the feedback current, the threshold corresponding to the detection distance can be changed without changing the consumption current of the oscillation circuit 10.

The threshold setting part 40 is a digital-to-analog (D/A) conversion circuit (hereinafter referred to as "first D/A conversion circuit") having an output voltage range wider than the range of change in the oscillation amplitude and having a resolution of a predetermined bit number (hereinafter referred to as "first bit number"). The first D/A conversion circuit converts the input voltage value signal into an analog signal, and outputs the converted voltage signal to the comparing part 20.

The current value signal generated by the current value signal generating part 33 is input to the current value setting part 50. The current value setting part 50 is configured to set the analog signal converted from the current value signal as the current value of the feedback current. In this way, based on the detection distance and the voltage value signal, the current value signal indicating the digital quantity of the current value is generated, and the analog signal converted from the current value signal is set as the current value of the feedback current. Also, as described above, the current value of the feedback current can be determined by the detection distance and the threshold for the oscillation amplitude by using the relationship among the current value of the feedback current, the detection distance, and the threshold for the oscillation amplitude. Therefore, with the relationship of the oscillation amplitude in the detection distance with respect to the voltage value indicated by the voltage value signal, that is, the threshold set for the oscillation amplitude, such as being higher or lower than or equal to the threshold, the current value of the feedback current can be set. Therefore, compared to the case of changing the current value of the feedback current when the threshold is kept constant, the amount in which the feedback current is changed can be reduced.

Also, as described above, the current value signal is generated for the current value of the feedback current at which the oscillation amplitude in the detection distance is at the voltage value indicated by the voltage value signal. Accordingly, the current value of the feedback current can be set at a value at which the oscillation amplitude in the detection distance is set to be equal to the voltage value indicated by the voltage value signal, that is, the set threshold. Therefore, compared with the case where the threshold is kept constant, the set current value of the feedback current needs only a subtle amount of change such that the oscillation amplitude becomes equal to the threshold changed based on the detection distance. Therefore, the configuration for suppressing the change in the consumption current of the oscillation circuit due to the set distance can be realized easily.

The current value setting part 50 is configured to include a D/A conversion circuit (hereinafter referred to as "second D/A conversion circuit") having a resolution of a predetermined bit number (hereinafter referred to as "second bit number"). The second D/A conversion circuit converts the input current value signal into an analog signal and outputs the converted voltage signal to the feedback current changing circuit 12.

The first bit number of the first D/A conversion circuit included in the threshold setting part 40 may be smaller than the second bit number of the second D/A conversion circuit included in the current value setting part 50. Accordingly, the first D/A conversion circuit only needs to have a range of change in the output voltage wider than the range of change in the oscillation amplitude and a resolution lower than that of the second D/A conversion circuit. Therefore, for setting the threshold for the oscillation amplitude, the circuit area is reduced, the proximity sensor can be downsized, and the cost of parts can be reduced as compared to the case where a D/A conversion circuit having a wide range of change as well as a high resolution (high accuracy) is included.

Also, as described above, the current value setting part 50 includes the second D/A conversion circuit having a resolution of the second bit number. Accordingly, since the second D/A conversion circuit includes a D/A conversion circuit having a higher resolution than that of the first D/A conversion circuit, the voltage value of the feedback current can be set with high accuracy. Meanwhile, since the threshold can be set within a wide range of the first D/A conversion circuit, the second D/A conversion circuit only needs to have a narrow range of change. Therefore, for setting the voltage value of the feedback current, the circuit area is reduced, the proximity sensor can be downsized, and the cost of parts can be reduced as compared to the case where a D/A conversion circuit with a wide range of change as well as a high resolution (high accuracy) is included.

Specifically, the first bit number of the first D/A conversion circuit is 6 bits. Accordingly, the first D/A conversion circuit having an output voltage range wider than the range of change in the oscillation amplitude and having a lower resolution than that of the second D/A conversion circuit can be easily constructed.

Also, the second bit number of the second D/A conversion circuit is 13 bits. Accordingly, the second D/A conversion circuit having a higher resolution than that of the first D/A conversion circuit can be easily constructed.

A detection result is input to the output circuit 60 from the detecting part 31. The output circuit 60 is configured to output the detection result of the detecting part 31 to an external device. More specifically, the output circuit 60 outputs a binary signal corresponding to the detection result of the detecting part 31. For example, when the detecting part 31 detects the target object TA, that is, when the target object TA is present, the output circuit 60 outputs a signal of a relatively high value, such as a High level signal. On the other hand, when the detecting part 31 does not detect the target object TA, that is, when the target object TA is not present, the output circuit 60 outputs a signal of a relatively low value, such as a Low level signal.

Further, the output circuit 60 is configured to perform IO-LINK communication with the external device. The output circuit 60 can perform data communication using the setting information of the proximity sensor 100 and analog signals, such as the control signal, the amplitude voltage, etc., as digital values through connection with a higher master device. At this time, a detection distance adjustment command transmitted from the master device is received by the output circuit 60 and input to the control part 30. Then, with the control part 30 generating data corresponding to the signal, the detection distance can be input to the proximity sensor 100.

The operating part 70 serves to input information through operation of a user. Specifically, the operating part 70 serves to input detection distance information or the detection distance adjustment command. The operating part 70 can be configured to include, for example, a button, a switch, etc. In this example, when the user operates the button, the switch, etc., a signal corresponding to the operation is input to the control part 30. Then, the control part 30 generates data corresponding to the signal, so that the detection distance can be input to the proximity sensor 100.

In this embodiment, the example shown in FIG. 1 is shown as the configuration of proximity sensor 100, but the disclosure is not limited to this example. The proximity sensor may further include, for example, a display device, such as a display.

Operation Example

Figure 5:
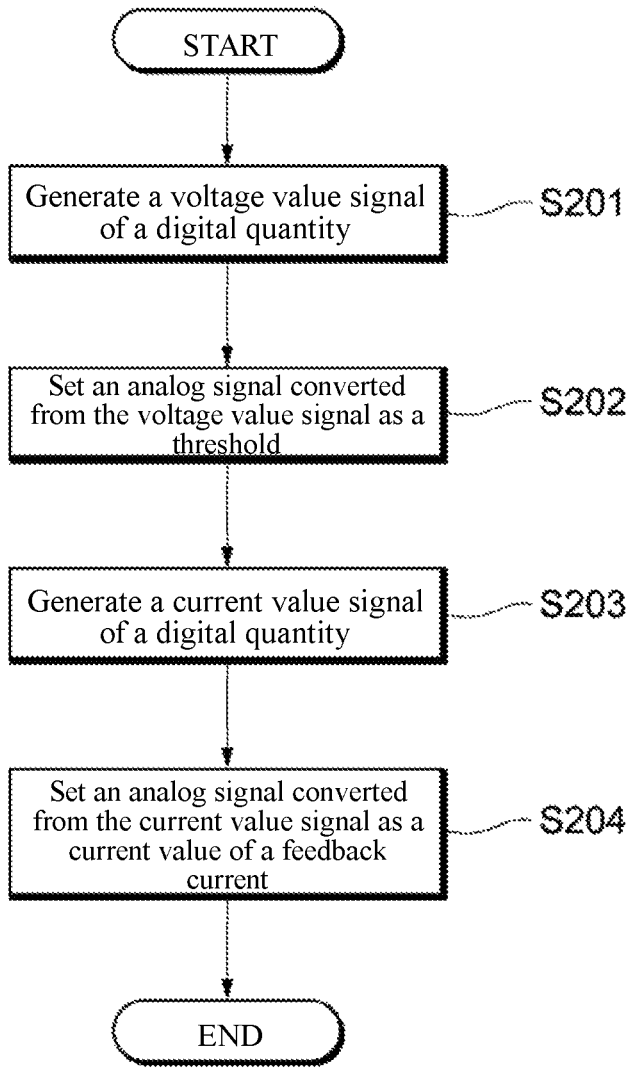
FIG. 5 is a flowchart illustrating a schematic operation of changing the detection distance of the proximity sensor.
Figure 6:
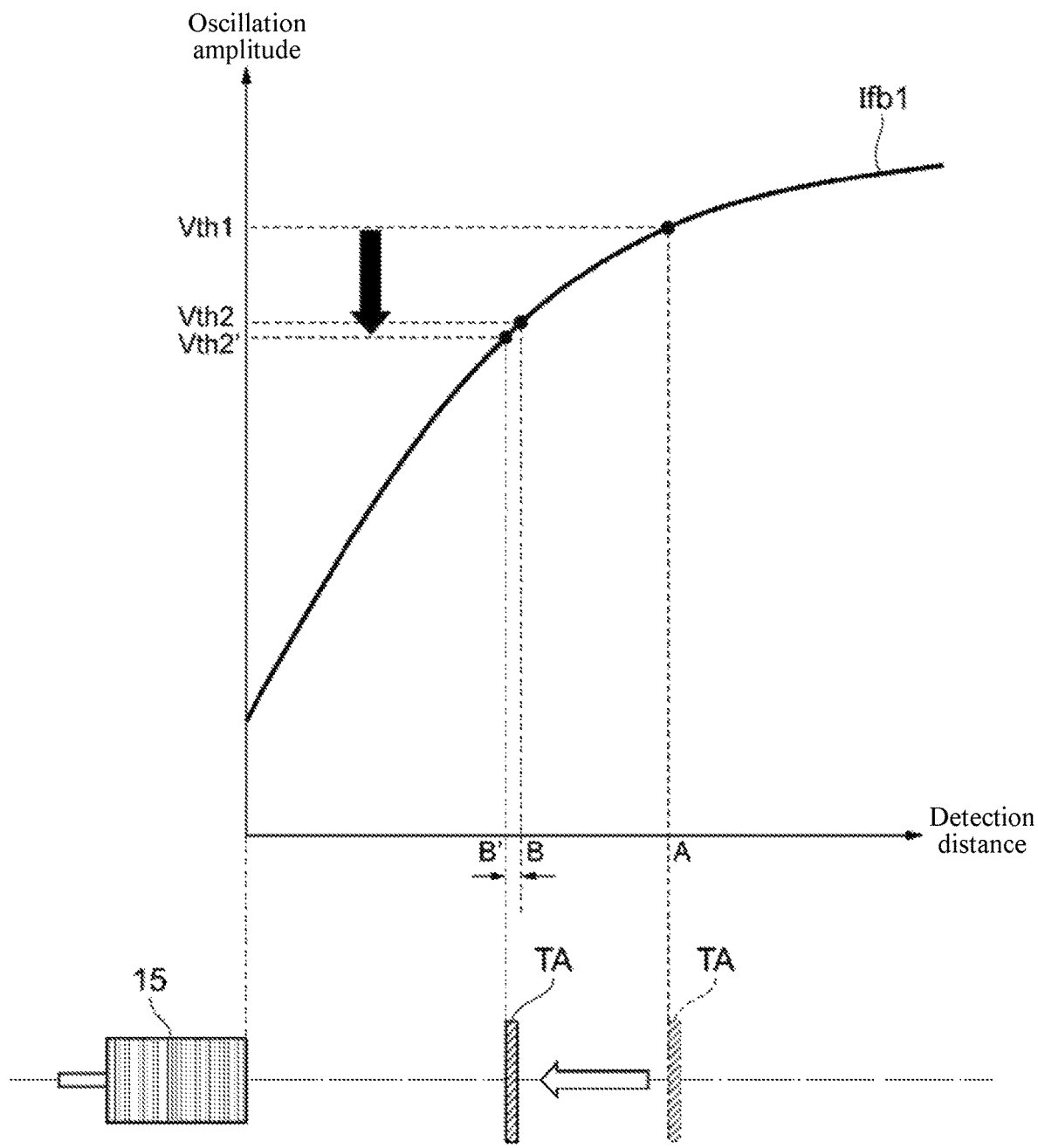
FIG. 6 is a diagram illustrating an operation of setting a threshold for the oscillation amplitude.
Figure 7:
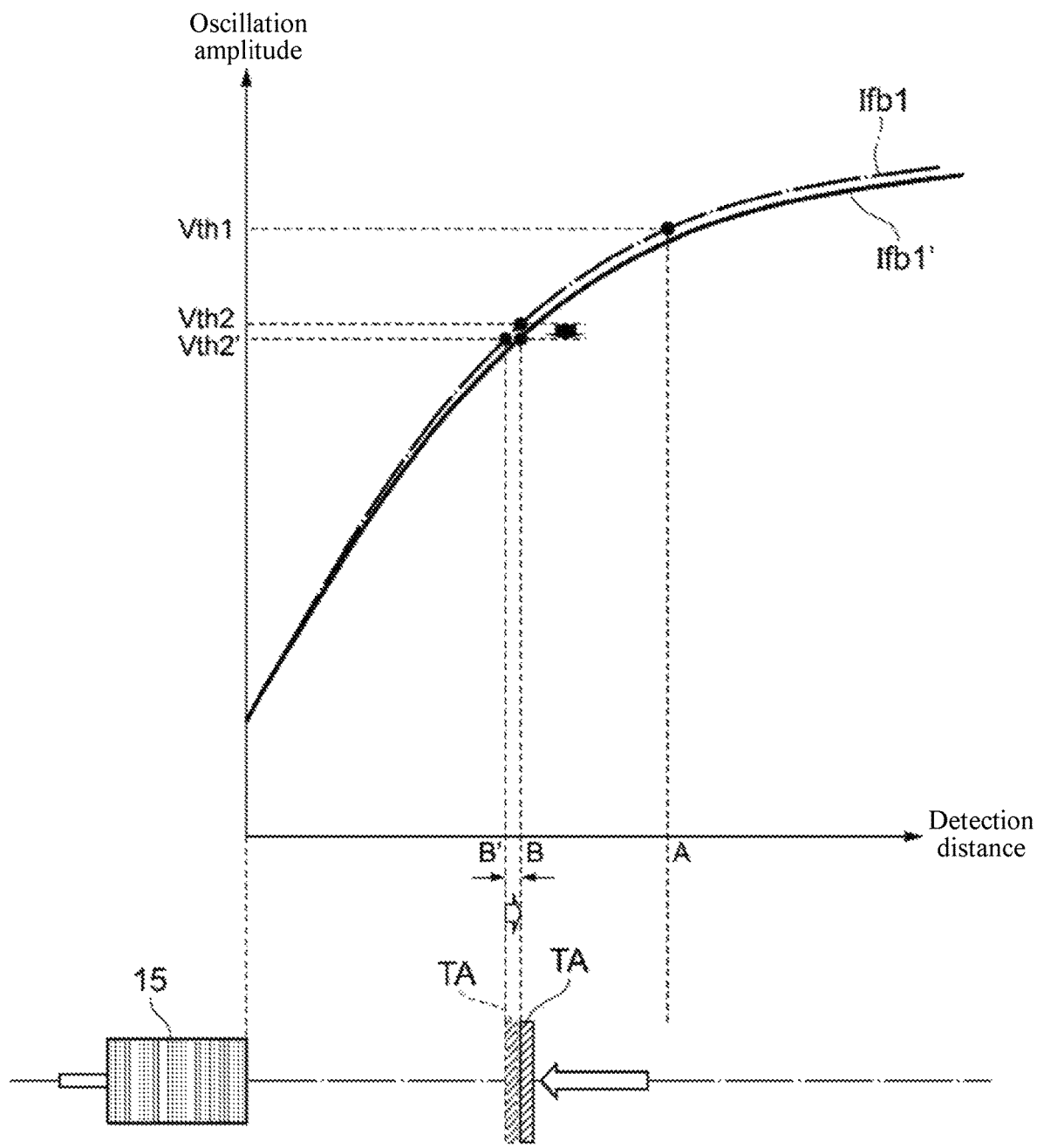
FIG. 7 is a diagram illustrating an operation of setting the current value of a feedback current.

Next, an example of the operation of the proximity sensor 100 according to this embodiment will be described with reference to FIGS. 5 to 7. FIG. 5 is a flowchart illustrating a schematic operation of changing the detection distance of the proximity sensor 100. FIG. 6 is a diagram illustrating an operation of setting the threshold for oscillation amplitude. FIG. 7 is a diagram illustrating an operation of setting the current value of the feedback current.

For example, after configuring the target object TA in the detection distance to be adjusted, when the user inputs the detection distance information or the detection distance adjustment command by operating the operating part 70, or when the output circuit 60 receives the detection distance adjustment command through IO-LINK communication, the proximity sensor 100 executes a detection distance changing process S200 shown in FIG. 5. In the following, an example in which the detection distance A is changed to the detection distance B (detection distance A>detection distance B) is described.

As shown in FIG. 5, firstly, the voltage value signal generating part 32 generates the voltage value signal based on the current value of the feedback current stored in the memory or the like and the detection distance information or the detection distance adjustment command input from the operating part 70 or the detection distance adjustment command received by the output circuit 60 through IO-LINK communication (Step S201). At this time, the voltage value signal generating part 32 generates the voltage value signal indicating the digital quantity of the voltage value corresponding to the detection distance under the oscillation amplitude at the time of maintaining the current value of the feedback current. The digital quantity of the voltage value signal is 6 bits.

Next, the threshold setting part 40 sets the analog signal converted from the voltage value signal as the threshold (Step S202).

In the case of changing the detection distance A to the detection distance B, as shown in FIG. 6, in the state of maintaining the current value Ifb1 of the feedback current at the time of the detection distance A, the voltage value signal indicating the voltage value corresponding to the detection distance B is generated, and the analog signal converted from the voltage value signal is set as a threshold Vth2'.

Here, under the oscillation amplitude at the time when the feedback current is at the current value Ifb1, the voltage value corresponding to the detection distance B is actually a voltage value Vth2. However, since the digital quantity of the voltage value signal is represented in 6 bits and the resolution of the first D/A conversion circuit of the threshold setting part 40 is 6 bits, there is an error between the set threshold Vth2' and the voltage value Vth2 to be adjusted actually. Therefore, at this stage, the threshold Vth2' corresponding to a detection distance B' is set. Meanwhile, since the current value Ifb1 of the feedback current is maintained, the consumption current of the oscillation circuit 10 does not change.

Returning to the description of FIG. 5, next, the current value signal generating part 33 generates the current value signal based on the detection distance information or the detection distance adjustment command input from the operating part 70 or the detection distance adjustment command received by the output circuit 60 through IO-LINK communication and the voltage value signal generated in Step S201 (Step S203). At this time, the current value signal generating part 33 generates the current value signal for the current value of the feedback current at which the oscillation amplitude in the detection distance is at the voltage value indicated by the voltage value signal. The digital quantity of the current value signal is 13 bits.

Next, the current value setting part 50 sets the analog signal converted from the current value signal as the current value of the feedback current (Step S204). After Step S204, the proximity sensor 100 terminates the detection distance changing process S200.

In the case of changing the detecting distance A to the detection distance B, the threshold Vth2' is set in Step S202, as described above. As shown in FIG. 7, the current value signal is generated for the current value of the feedback current at which the oscillation amplitude in the detection distance B is at the voltage value indicated by the voltage value signal, that is, the threshold Vth2', or higher, and the analog signal converted from the current value signal is set as a current value Ifb1' of the feedback current.

Here, since the digital quantity of the current value signal is represented in 13 bits and the resolution of the second D/A conversion circuit of the current value setting part 50 is 13 bits, the error between the threshold Vth2' and the actual voltage value Vth2 is eliminated, and the detection distance B' is corrected to the detection distance B. While an error of less than 13 bits may, in theory, occur in the current value Ifb1' of the feedback current set in Step S204, the error is actually negligible. Meanwhile, since the feedback current is changed from the current value Ifb1 to the current value Ifb1', the consumption current of the oscillation circuit 10 changes. However, since the current value of the feedback current only needs to be changed to eliminate the error between the threshold Vth2' and the actual voltage value Vth2, the amount in which the current value of the feedback current is changed remains subtle.

As described above, in this embodiment, based on the feedback current and the detection distance indicating the distance from the coil 11a to the position where the target object TA can be detected, the voltage value signal indicating the digital quantity of the voltage value is generated, and the analog signal converted from the voltage value signal is set as the threshold. Here, as described above, the threshold for the oscillation amplitude can be determined by the current value of the feedback current and the detection distance by using the relationship among the current value of the feedback current, the detection distance, and the threshold for the oscillation amplitude. Accordingly, under the oscillation amplitude of the current feedback current, the threshold based on the detection distance can be set. Also, based on the detection distance and the voltage value signal, the current value signal indicating the digital quantity of the current value is generated, and the analog signal converted from the current value signal is set as the current value of the feedback current. As described above, the current value of the feedback current can be determined by the detection distance and the threshold for the oscillation amplitude by using the relationship among the current value of the feedback current, the detection distance, and the threshold for the oscillation amplitude. Accordingly, with the relationship of the oscillation amplitude in the detection distance with respect to the voltage value indicated by the voltage value signal, that is, the threshold set for the oscillation amplitude, such as being higher or lower than or equal to the threshold, the current value of the feedback current can be set. Therefore, compared to the case of changing the current value of the feedback current when the threshold is kept constant, the amount in which the feedback current is changed can be reduced. Thus, the change in the consumption current of the oscillation circuit due to the set distance can be suppressed.

The embodiments described above are provided to facilitate the understanding to the disclosure and are not intended to limit the disclosure. The elements, arrangements, materials, conditions, shapes, sizes, etc. of the embodiments are not limited to those exemplified and can be appropriately changed. In addition, it is possible to partially replace or combine the configurations shown in the different embodiments.

APPENDIX

1. A proximity sensor 100, including:
an oscillation circuit 10 including a coil 11a and having an oscillation amplitude that changes with a feedback current;

a comparing part 20 comparing the oscillation amplitude with a threshold;

a detecting part 31 detecting a target object TA based on a comparison result of the comparing part 20;

a voltage value signal generating part 32 generating a voltage value signal indicating a digital quantity of a voltage value based on the feedback current and a detection distance indicating a distance from the coil 11a to a position where the target object TA can be detected;

a threshold setting part 40 setting an analog signal converted from the voltage value signal as the threshold;

a current value signal generating part 33 generating a current value signal indicating a digital quantity of a current value based on the detection distance and the voltage value signal; and a current value setting part 50 setting an analog signal converted from the current value signal as a current value of the feedback current.

8. A method of changing a detection distance, by which a proximity sensor 100 changes the detection distance indicating a distance from a coil 11a to a position where a target object TA can be detected, the proximity sensor 100 including an oscillation circuit 10 that includes the coil 11a and has an oscillation amplitude that changes with a feedback current, a comparing part 20 that compares the oscillation amplitude with a threshold, and a detecting part 31 that detects the target object based on a comparison result of the comparing part, and the method including:

generating a voltage value signal indicating a digital quantity of a voltage value by a voltage value signal generating part 32 based on the feedback current and the detection distance;

setting an analog signal converted from the voltage value signal as the threshold by a threshold setting part 40;

generating a current value signal indicating a digital quantity of a current value by a current value signal generating part 33 based on the detection distance and the voltage value signal; and setting an analog signal converted from the current value signal as the current value of the feedback current by a current value setting part 50.

What is claimed is:

1. A proximity sensor, comprising:
an oscillation circuit comprising a coil and having an oscillation amplitude that changes with a feedback current;
a comparing part comparing the oscillation amplitude with a threshold;
a detecting part detecting a target object based on a comparison result of the comparing part;
a first signal generating part generating a first signal with respect to the voltage value corresponding to a detection distance under the oscillation amplitude at a time when the current value of the feedback current as a previous feedback current value stored in a memory, so that the first signal indicates a digital quantity of a voltage value based on the feedback current and the detection distance, the detection distance indicating a distance from the coil to a position where the target object can be detected;
a threshold setting part setting an analog signal converted from the first signal as the threshold;
a second signal generating part generating a second signal with respect to the current value of the feedback current at which the oscillation amplitude in the detection distance is at the voltage value indicated by the first signal, so that the second signal indicates a digital quantity of a current value based on the detection distance and the first signal, that current value being stored in the memory as the previous feedback current; and
a current value setting part setting an analog signal converted from the second signal as a current value of the feedback current.

2. The proximity sensor according to claim 1, wherein the threshold setting part comprises a first D/A conversion circuit having an output voltage range wider than a range of change in the oscillation amplitude and having a resolution of a first bit number,
wherein the current value setting part comprises a second D/A conversion circuit having a resolution of a second bit number, and
wherein the first bit number is smaller than the second bit number.

3. The proximity sensor according to claim 1, wherein the threshold setting part comprises a first D/A conversion circuit having an output voltage range wider than a range of change in the oscillation amplitude and having a resolution of a first bit number,
wherein the current value setting part comprises a second D/A conversion circuit having a resolution of a second bit number, and
wherein the first bit number is smaller than the second bit number.

4. The proximity sensor according to claim 1, wherein the threshold setting part comprises a first D/A conversion circuit having an output voltage range wider than a range of change in the oscillation amplitude and having a resolution of a first bit number,
wherein the current value setting part comprises a second D/A conversion circuit having a resolution of a second bit number, and
wherein the first bit number is smaller than the second bit number.

5. The proximity sensor according to claim 2, wherein the first bit number is 6 bits and the second bit number is 13 bits.

6. The proximity sensor according to claim 1, further comprising:
an operating part for inputting detection distance information or a detection distance adjustment command.

7. The proximity sensor according to claim 1, further comprising:
an operating part for inputting detection distance information or a detection distance adjustment command.

8. The proximity sensor according to claim 1, further comprising:
an output circuit receiving a detection distance adjustment command through IO-LINK communication.

9. The proximity sensor according to claim 1, further comprising:
an output circuit receiving a detection distance adjustment command through IO-LINK communication.

10. A method of changing a detection distance, by which a proximity sensor changes the detection distance indicating a distance from a coil to a position where a target object can be detected, the proximity sensor comprising an oscillation circuit that comprises the coil and has an oscillation amplitude that changes with a feedback current, a comparing part that compares the oscillation amplitude with a threshold, and a detecting part that detects the target object based on a comparison result of the comparing part, and the method comprising:
generating a first signal with respect to the voltage value corresponding to the detection distance by a first signal generating part under the oscillation amplitude at a time when the current value of the feedback current as a previous feedback current value stored in a memory, so that the first signal indicates a digital quantity of a voltage value based on the feedback current and a detection distance;

setting an analog signal converted from the first signal as the threshold by a threshold setting part;

generating a second signal with respect to the current value of the feedback current at which the oscillation amplitude in the detection distance is at the voltage value indicated by the first signal, so that the second signal indicates a digital quantity of a current value by a second signal generating part based on a detection distance and the first signal, that current value being stored in the memory as the previous feedback current; and setting an analog signal converted from the second signal as a current value of the feedback current by a current value setting part.

11. The method of changing the detection distance according to claim 10, further comprising:

inputting detection distance information or a detection distance adjustment command to an operating part.

12. The method of changing the detection distance according to claim 10, further comprising:

inputting detection distance information or a detection distance adjustment command to an operating part.

13. The method of changing the detection distance according to claim 10, further comprising:

receiving, by an output circuit, a detection distance adjustment command through IO-LINK communication.

14. The method of changing the detection distance according to claim 10, further comprising:

receiving, by an output circuit, a detection distance adjustment command through IO-LINK communication.

* * * * *